(12) United States Patent
Zhang et al.

(10) Patent No.: US 7,252,516 B1
(45) Date of Patent: Aug. 7, 2007

(54) ADJUSTABLE-SIZE, MOTHER BOARD

(75) Inventors: Jie Zhang, Shenzhen (CN);
Xiong-Dong Peng, Shenzhen (CN);
Ke-Cheng Lin, Taipei Hsien (TW);
Chien-Li Tsai, Taipei Hsien (TW)

(73) Assignees: Hong Fu Jin Precision Industry (ShenZhen) Co., Ltd., Shenzhen, Guangdong (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/625,284

(22) Filed: Jan. 20, 2007

(30) Foreign Application Priority Data

Apr. 5, 2006 (CN) .................... 2006 1 0060190

(51) Int. Cl.
*H01R 12/00* (2006.01)
(52) U.S. Cl. ........................................ 439/67

(58) Field of Classification Search ............... 439/65, 439/67; 361/748, 758, 749, 804, 760, 742, 361/770
See application file for complete search history.

(56) References Cited

U.S. PATENT DOCUMENTS

| 4,657,320 | A * | 4/1987 | Bamford et al. ............... 439/31 |
| 5,599,192 | A * | 2/1997 | Olson ........................... 439/65 |
| 6,497,579 | B1 * | 12/2002 | Garbini ......................... 439/63 |
| 6,688,892 | B2 * | 2/2004 | Fukumoto et al. ............ 439/65 |
| 6,935,868 | B1 * | 8/2005 | Campini et al. ............... 439/67 |
| 2006/0035482 | A1 * | 2/2006 | Yasumura et al. ............ 439/65 |

* cited by examiner

*Primary Examiner*—Tho D. Ta
(74) *Attorney, Agent, or Firm*—Wei Te Chung

(57) ABSTRACT

A motherboard includes a first circuit board, a second circuit board, and a connecting member. The connecting member movably connects the first circuit board and the second circuit board, and the connecting member is capable of adjusting a relative position of the first circuit board to the second circuit board.

12 Claims, 4 Drawing Sheets

ADJUSTABLE-SIZE, MOTHER BOARD

BACKGROUND OF THE INVENTION

1. Field of the Invention

The present invention relates to a motherboard, and more particularly to a motherboard for a portable computer.

2. Description of Related Art

With the development of computer technology, use of portable computers has become widespread because of their relatively small size and portability. Different size portable computers are designed to meet the needs of different users, and therefore different motherboards are required to fit for the different size portable computers. However, manufacturing so many different size motherboards is a waste of time and money.

What is needed, therefore, is a motherboard which is compatible with different size portable computers.

SUMMARY OF THE INVENTION

An exemplary motherboard includes a first circuit board, a second circuit board, and a connecting member. The connecting member movably connects the first circuit board and the second circuit board, and the connecting member is capable of adjusting a relative position of the first circuit board to the second circuit board.

Other advantages and novel features will become more apparent from the following detailed description of preferred embodiment when taken in conjunction with the accompanying drawings, in which:

DETAILED DESCRIPTION OF THE INVENTION

Figure 1:
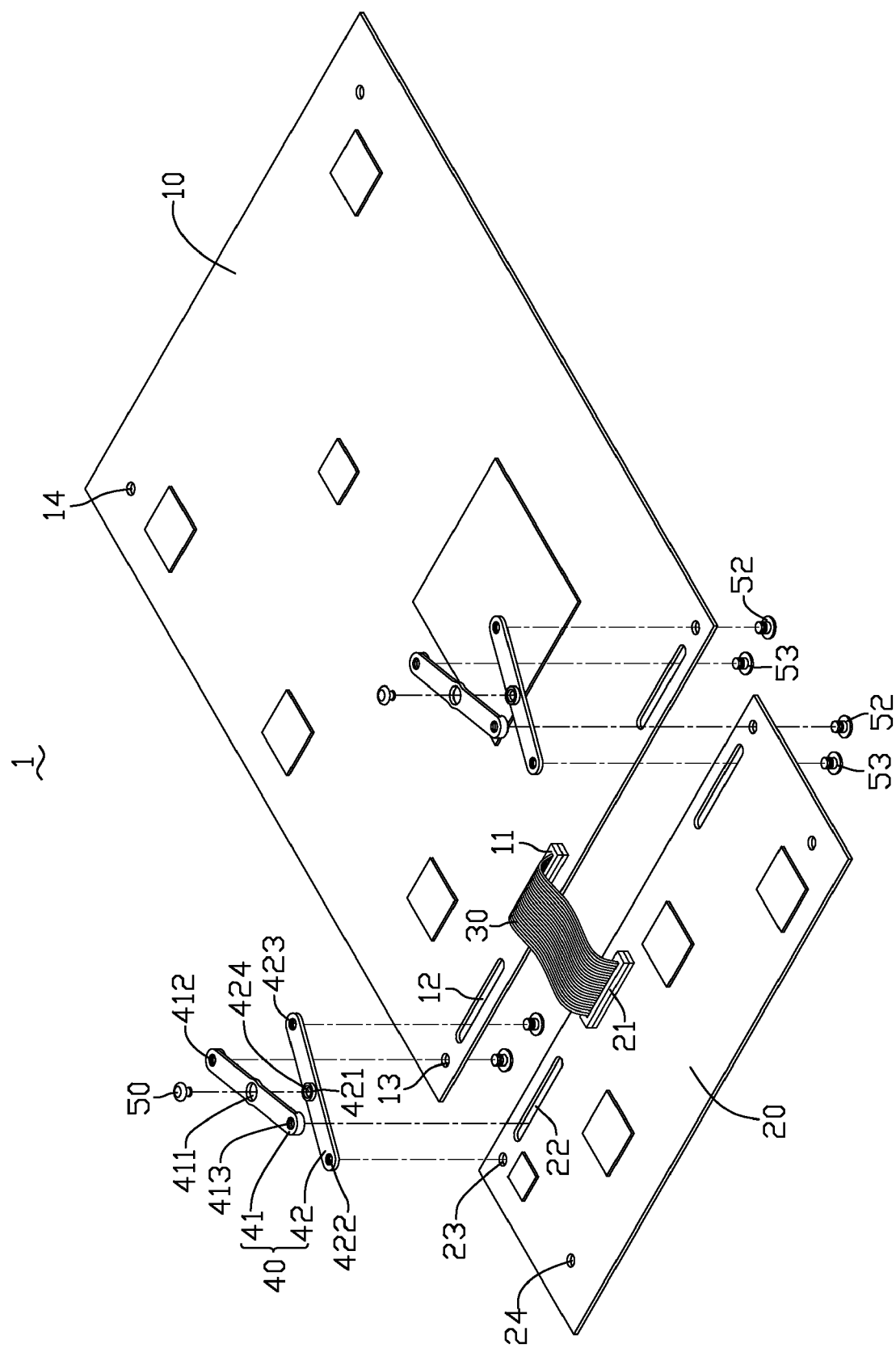
FIG. 1 is an exploded, isometric view of a motherboard in accordance with a preferred embodiment of the present invention.

Referring to FIG. 1, a motherboard 1 for a portable computer is provided in accordance with a preferred embodiment of the present invention. The motherboard 1 includes a first circuit board 10, a second circuit board 20, a cable 30, and a pair of connecting members 40.

The first circuit board 10 defines a pair of sliding slots 12 adjacent a first edge thereof. A positioning hole 13 is defined in the first circuit board 10 adjacent an end of each sliding slot 12. Two spaced fixing holes 14 are defined in the first circuit board 10 adjacent a second edge opposite the first edge thereof. A socket 11 is installed in the first circuit board 10 between the sliding slots 12.

The second circuit board 20 defines a pair of sliding slots 22 and a pair of positioning holes 23 adjacent an edge thereof, corresponding to the sliding slots 12 and the positioning holes 13 of the first circuit board 10 respectively. A socket 21 is installed in the second circuit board 20 between the sliding slots 22, corresponding to the socket 11 of the first circuit board 10. Two spaced fixing holes 24 are defined in the second circuit board 20 adjacent another edge away from the sliding slots 22.

Each connecting member 40 includes a first connecting piece 41 and a second connecting piece 42. The first connecting piece 41 and the second connecting piece 42 are bar-shaped. The first connecting piece 41 defines a through hole 411 in a middle section thereof. A first threaded hole 412 and second threaded hole 413 are defined adjacent two ends of the first connecting piece 41 respectively. The second connecting piece 42 forms a protrusion 421 in a middle section thereof, corresponding to the through hole 411 of the first connecting piece 41. A threaded aperture 424 is defined in the protrusion 421. A first threaded hole 422 and second threaded hole 423 are defined adjacent two ends of the second connecting piece 42 respectively.

Figure 2:
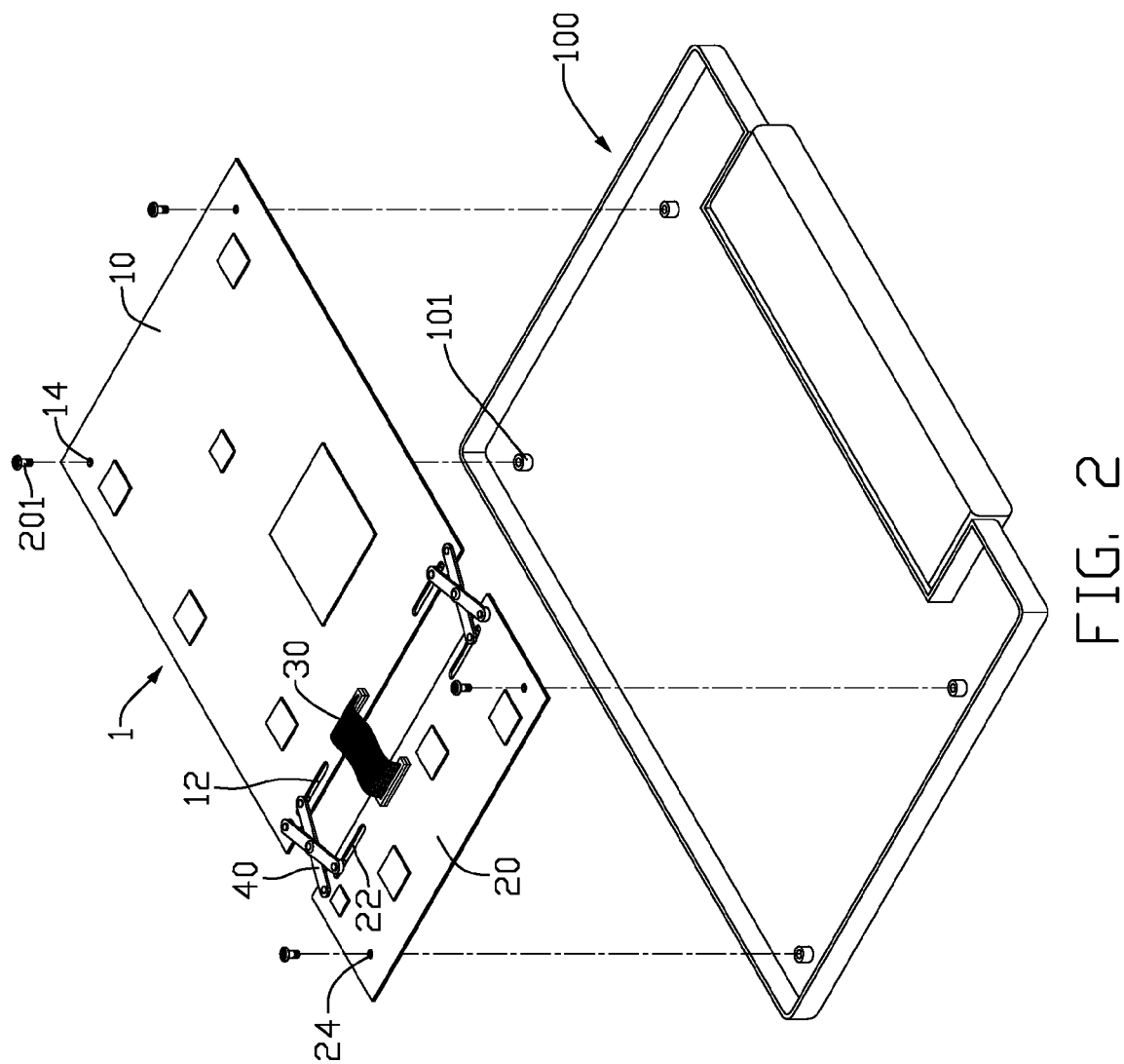
FIG. 2 is an assembled view of FIG. 1, together with a base of a portable computer.

Referring further to FIG. 2, in assembly, the protrusion 421 of each second connecting piece 42 is inserted into the through hole 411 of the corresponding first connecting piece 41. A fixing member such as a screw 50 is screwed into the threaded aperture 424 of each protrusion 42, with a head portion of the screw 50 engaging with the corresponding first connecting piece 41. Thereby, each first connecting piece 41 and the corresponding second connecting piece 42 are pivotably connected by the screw 50. Four fasteners such as screws 52 extend through the positioning holes 13, 23 from under the first circuit board 10 and the second circuit board 20 respectively, and are screwed into the first threaded holes 412, 422 of the corresponding first connecting piece 41 and the corresponding second connecting piece 42, with head portions of the screws 52 engaging with bottoms of the first circuit board 10 and the second circuit board 20. Thereafter, the first connecting pieces 41 and the second connecting pieces 42 are rotated to allow the second threaded holes 413, 423 thereof to align with the corresponding sliding slots 22, 12. Four fasteners such as screws 53 extend through the sliding slots 22, 12 from under the first circuit board 10 and the second circuit board 20 respectively, and are screwed into the second threaded holes 413, 423 of the corresponding first connecting pieces 41 and the corresponding second connecting pieces 42, with head portions of the screws 53 engaging with the bottoms of the first circuit board 10 and the second circuit board 20. Therefore, ends of the first connecting pieces 41 and the second connecting pieces 42 adjacent the corresponding second threaded holes 413, 423 are slidably fixed to the second circuit board 20 and the first circuit board 10 respectively, and the first circuit board 10 and the second circuit board 20 are movably connected by the connecting members 40. An amount of space between the first circuit board 10 and the second circuit board 20 is adjustable. Finally, two ends of the cable 30 are electrically connected to the sockets 11, 21 of the first circuit board 10 and the second circuit board 20 respectively.

The portable computer includes a base 100, four posts 101 having threaded holes defined therein are formed on the base 100 adjacent four corners of the base 100 respectively. The amount of space between the first circuit board 10 and the second circuit board 20 is adjusted in a first direction by sliding the first and second connecting pieces 41, 42 of each connecting member 40 along the corresponding sliding slots 12, 22 in a second direction perpendicular to the first direction, until a desired size of the motherboard 1 is achieved. Four screws 201 extend through the fixing holes 14, 24 of the first circuit board 10 and the second circuit board 20 respectively, and then are screwed into the threaded holes of the corresponding posts 101 of the base 100.

Figure 3:
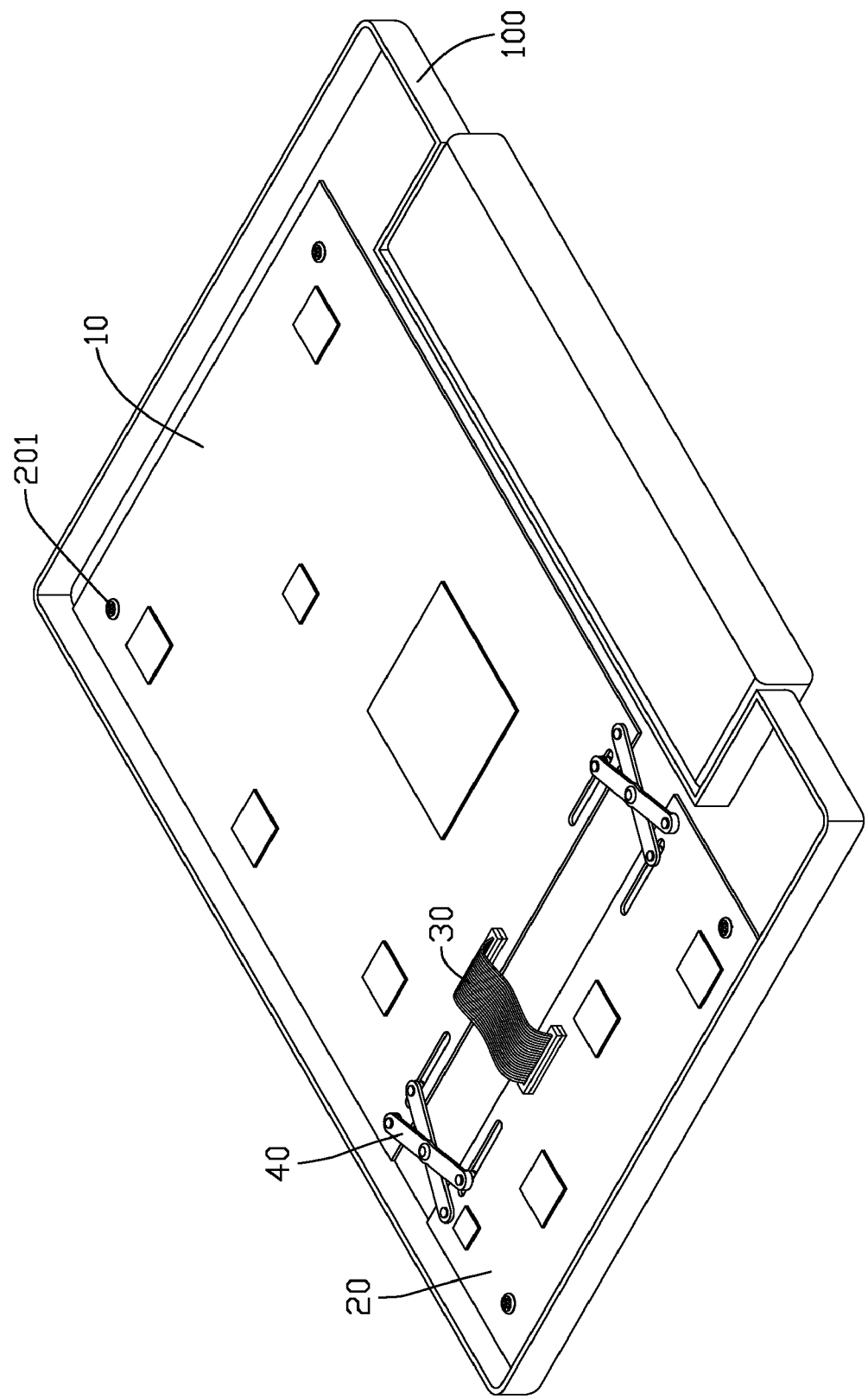
FIG. 3 is an assembled view of FIG. 2.

Thereby, the motherboard 1 is fixed to the base 100 of the portable computer, as shown in FIG. 3.

Figure 4:
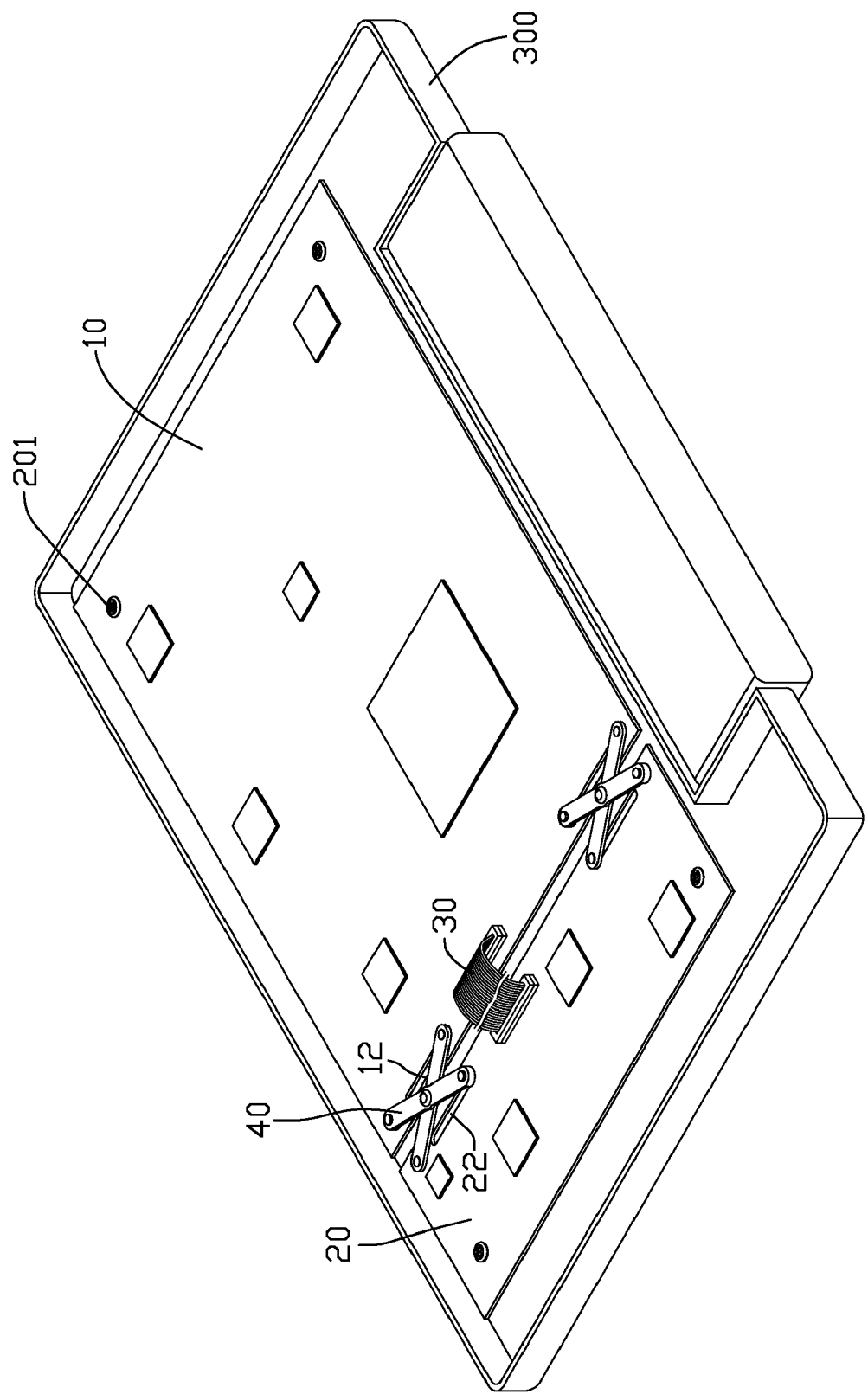
FIG. 4 is similar to FIG. 3, but showing the motherboard installed in a base of another portable computer with a different size.

Referring further to FIG. 4, when the motherboard 1 is required to be installed in a base 300 of another portable computer with a different size, the connecting members 40 are slid along the corresponding sliding slots 12, 22 of the first circuit board 10 and the second circuit board 20 to adjust the space between the first and second circuit boards 10, 20, by manipulating the first and second circuit boards 10, 20 until a new desired size of the motherboard 1 is achieved. Thereafter, the motherboard 1 is fixed to the base 300 of the portable computer with the screws 201.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A motherboard comprising: a first circuit board; a second circuit board; and a connecting member movably connecting the first circuit board and the second circuit board, the connecting member being capable of adjusting a relative position of the first circuit board to the second circuit board;

wherein the connecting member comprises a first connecting piece, and a second connecting piece pivotably connected to the first connecting piece; and wherein the first connecting piece defines a through hole in a middle section thereof, and a protrusion is formed on a middle section of the second connecting piece to be pivotably inserted into the through hole of the first connecting piece for allowing relative movement of the first and second connecting pieces.

2. The motherboard as claimed in claim 1, wherein the protrusion of the second connecting piece defines a hole therein, and a fixing member is insertable into the hole to combine the first and second connecting pieces.

3. The motherboard as claimed in claim 1, wherein a socket is installed in each of the first circuit board and the second circuit board, and a cable is connected to the sockets to electrically connect the first and second circuit boards.

4. The motherboard as claimed in claim 1, wherein one end of each of the first connecting piece and the second connecting piece is fixed to the first circuit board and the second circuit board respectively, and the other end of each of the first connecting piece and the second connecting piece is slidably connected to the second circuit board and the first circuit board respectively.

5. The motherboard as claimed in claim 4, wherein each of the first circuit board and the second circuit board defines a positioning hole, the one end of each of the first connecting piece and the second connecting piece defines a hole, two fasteners extend through the positioning holes and are screwed into the corresponding holes of the connecting member.

6. The motherboard as claimed in claim 4, wherein each of the first circuit board and the second circuit board defines a sliding slot, the other end of each of the first connecting piece and the second connecting piece defines a hole, two fasteners extend through the sliding slots of the first circuit board and the second circuit board, and are screwed into the corresponding holes of the second connecting piece and the first connecting piece.

7. A motherboard comprising:

a first circuit board;

a second circuit board spaced apart from the first circuit board;

a connecting member mechanically connecting the first and second circuit boards and allowing adjustment to an amount of space therebetween thereby adjusting a size of the motherboard, wherein the connecting member comprises a first connecting piece and a second connecting piece, the first connecting piece has one end pivotably fixed to one of the first and second circuit boards, and another end slidably connected to the other one of the first and second circuit boards, the second connecting piece has one end pivotably fixed to one of the first and second circuit boards, and another end slidably connected to the other one of the first and second circuit boards; and a cable electrically connecting the first and second circuit boards for allowing communication therebetween.

8. The motherboard as claimed in claim 7, wherein each of the first circuit board and the second circuit board defines a sliding slot, the other end of each of the first connecting piece and the second connecting piece defines a hole, two fasteners extend through the sliding slots of the first circuit board and the second circuit board, and are screwed into the corresponding holes of the second connecting piece and the first connecting piece, the fasteners being capable of sliding in the sliding slots to urge the connecting pieces to move the first and second circuit boards relative to each other to thereby adjust the amount of the space between the first circuit board and the second circuit board.

9. A motherboard fitting to different bases, comprising:

a first circuit board configured for installing electronic components thereon, the first circuit board defining a mounting hole configured for extension of a fastener to mount the first circuit board to one of the bases;

a second circuit board configured for installing other electronic components thereon, the second circuit board defining another mounting hole configured for extension of another fastener to mount the second circuit board to said one of the bases;

a connecting member mechanically connecting the first circuit board and the second circuit board in such a manner that allows the second circuit board being movable relative to the first circuit board in a first direction to adjust the distance between the mounting hole of the first circuit board and said another mounting hole of the second circuit board in the first direction whereby the motherboard is capable of fitting the different bases, wherein the connecting member comprises a first connecting piece having a first fixed end portion fixed to one of the first and second circuit boards and a first sliding end portion slidably attached to the other of the first and second circuit boards, the other of the first and second circuit boards defines a sliding slot, the first sliding end portion being slidable along the sliding slot in a second direction to urge the second circuit board to move relative to the first circuit board in the first direction, the second direction being perpendicular to the first direction; and a cable electrically connecting the first circuit board and the second circuit board.

10. The motherboard as claimed in claim 9, wherein the connecting member further comprises a second connecting piece having a second fixed end portion fixed to the other of the first and second circuit boards and a second sliding end portion slidably attached to said one of the first and second circuit boards.

11. The motherboard as claimed in claim 10, wherein said one of the first and second circuit boards defines another sliding slot, the second sliding end portion being slidable along said another sliding slot in the second direction to urge the second circuit board to move relative to the first circuit board in the first direction.

12. The motherboard as claimed in claim 11, wherein the second connecting piece is pivotably attached to the first connecting piece to form a cross configuration.

\* \* \* \* \*